July 7, 1970 K. J. MOYLE 3,518,750

METHOD OF MANUFACTURING A MISFET

Filed Oct. 2, 1968

2 Sheets-Sheet 1

INVENTOR
KENNETH J. MOYLE

BY Harvey J. [signature]

ATTORNEY

METHOD OF MANUFACTURING A MISFET

Filed Oct. 2, 1968

2 Sheets-Sheet 2

INVENTOR
KENNETH J. MOYLE
BY [signature]
ATTORNEY

United States Patent Office 3,518,750
Patented July 7, 1970

3,518,750
METHOD OF MANUFACTURING A MISFET

Kenneth J. Moyle, Los Altos Hills, Calif., assignor to National Semiconductor Corporation, Santa Clara, Calif., a corporation of Delaware Filed Oct. 2, 1968, Ser. No. 764,543
Int. Cl. H01l *11/14*
U.S. Cl. 29—571 6 Claims

ABSTRACT OF THE DISCLOSURE

A novel MISFET and method of manufacture involving a five mask process suitable for making N-channel devices alone, P-channel devices alone or both N and P-channel devices simultaneously. Novel topside contact means, field inversion protection means and gate breakdown protection means are disclosed.

BACKGROUND OF THE INVENTION

MISFET (metal - insulator - semiconductor field - effect transistor) or IGFET (isolated-gate field-effect transistor) devices as they are sometimes called, have been known for some time now and play an important role in modern integrated metal-oxide-semiconductor FET known in the art as the MOSFET.

The MOSFET is typically fabricated using a four-mask process wherein the heavily doped source and drain regions of one type of impurity are diffused into a substrate doped with the other type of impurity. An oxide grown over the surface of the substrate separating the source and drain regions insulates a metallic gate electrode from the semiconductive materials.

Due to the area of opposite conductivity type semiconductor separating the source and drain regions, a pair of source and drain contacts, and as a result, the channel current between source and drain is essentially zero for zero-gate bias. However, by applying voltage to the gate electrode, the polarity of which is determined by the conductivity-type of the channel region, a depletion region is formed at the surface of the semiconductor between source and drain which, with increased voltage, causes an inversion to occur, thus providing a conductive channel therebetween of the same conductivity as the source and drain regions. When this occurs, ohmic conduction begins between source and drain, the current flow being determinable by the magnitude of the voltage applied to the gate.

Although MISFET's fabricated in accordance with this and other prior art techniques have been used extensively in the past, these methods and the resulting devices typically suffer several disadvantages. One disadvantage of prior art methods is the lack of flexibility in terms of making N or P-channel devices from the same process using the same set of masks, or in fabricating simultaneously, both N and P-channel devices on the same substrate. Some N-channel processing methods even produce unstable and/or unpredictable device characteristics. Using some prior art methods, large shifts in device thresholds may occur during assembly or under bias and stress conditions applied to the device after assembly.

In addition, some prior art techniques result in low and unstable field inversion thresholds. Others fail to provide adequate protection against destruction of the gate dielectric through static electricity. Furthermore, many of these techniques do not provide topside contact to the substrates, thus space-consuming metal interconnects are necessary and certain packaging and hybridizing restrains result.

SUMMARY OF THE PRESENT INVENTION

This invention relates generally to fabrication techniques for integrated circuitry and more particularly to a novel complementary process for the fabrication of N and P-channel metal-insulator-silicon (MIS) field-effect transistors (FET).

The new five-mask technique to be described hereinafter is complementary in that either N or P-channel devices may be fabricated using the same set of masks and the same basic process. Furthermore, the technique provides that both N and P-channel devices may be made simultaneously on a suitable substrate.

The novel technique in one form utilizes the unique properties of antimony as a source and drain dopant in order to achieve a stable, reproducible N-channel process. Antimony has a low diffusion coefficient in silicon and silicon-dioxide and a low vapor pressure in comparison to phosphorous and arsenic which are commonly used as N-type dopants. These characteristics of antimony permit the wafer to be subjected to a series of high temperature operations after predeposition and diffusion without materially affecting the diffused structure or the gate area adjacent to the antimony source and drain of the N-channel devices. For example, a long gate oxidation at 1000° C. allows a thick oxide to be grown over the P and N regions without diffusing the N junction too far into the substrate.

In addition, the uncertainties associated with the field inverion threshold voltage magnitude and stability are eliminated by providing a highly doped diffused barrier between adjacent interconnected N or P regions. A topside ground is also provided which allows ground connections to be made on the chip without the necessity of running metal lines throughout the chip. As a consequence of the fact that no backside ohmic connection is required, certain packaging advantages are realized.

And since the novel technique requires both N and P diffusions, the process permit the simultaneous fabrication of a low voltage diode which can be used to protect the gate dielectric. For example, the breakdown voltage of this protective diode may be an order of magnitude lower than the breakdown voltage of the gate dielectric depending on the dopant concentrations that are used.

These and other advantages and the objectives of the present invention will become apparent as one reads through the following detailed description of the preferred embodiments which makes reference to the several figures of the drawing.

IN THE DRAWING

DETAILED DESCRIPTION OF THE PREFERRED EMBODIMENT

Figure 1:
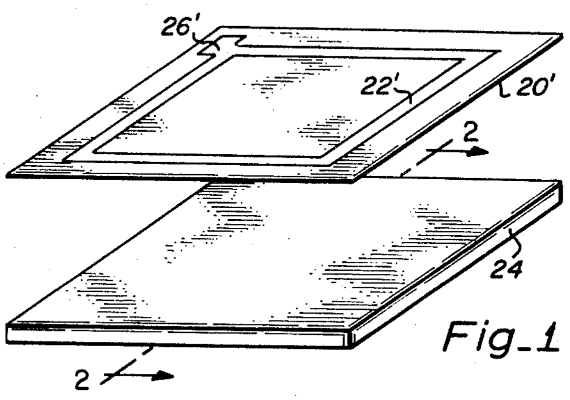
FIGS. 1–11 illustrate the five-mask process used in making a MISFET in accordance with the present invention.

Referring now to FIGS. 1–11 of the drawing, the five-mask process of the present invention is illustrated. The fundamental sequence of oxidations, predepositions and diffusions are substantially unaltered for fabrication of an N-channel, P-channel, or both N and P-channel devices. The only differences in making either N or P-channel devices, or both N and P-channel devices, is in the conductivity type of the starting substrate and the sequence of the first two masking stages.

As an illustrative example of the novel five-mask process and resulting MISFET structure, a sequence of steps for making a P-channel device will be described in detail. As shown in FIG. 1 of the drawing, the first mask 20, having a generally rectangular aperture 22′, is provided over the prepared N-type silicon substrate 24 and the composite structure is subjected to an antimony diffusion so as to cause a heavily doped N+ field inversion barrier 22 to be diffused into the surface of the substrate 24. By using antimony, which has a low diffusion coefficient, as the N-type dopant, the wafer may be subjected to a series of high temperature operations after predeposition and diffusion without materially affecting the diffused structure.

Figure 2:
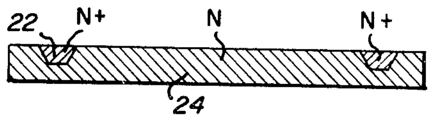

It will be noted that in addition to the barrier rectangle, the aperture in the mask 20 additionally includes a projection 26′ which will facilitate the provision of an external contact to the substrate 24. In FIG. 2 a cross section taken along the line 2—2 is shown after the first diffusion.

Figure 3:
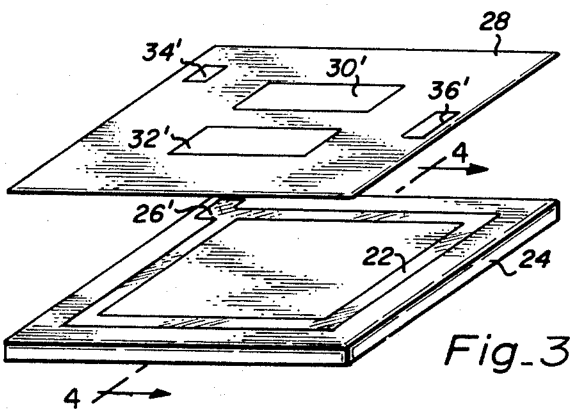
Figure 4:
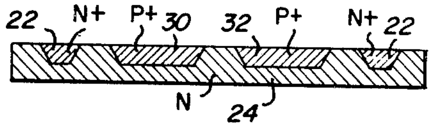
Figure 6:
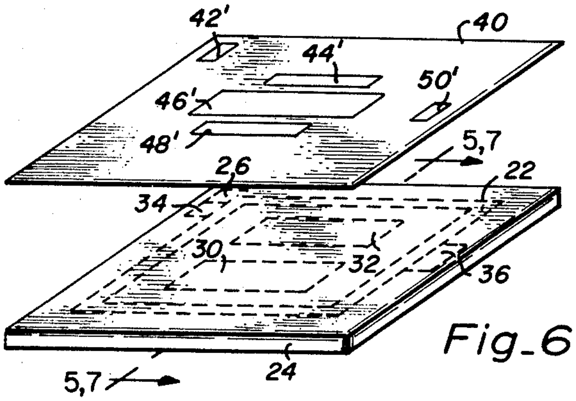

The second mask 28 is illustrated in FIG. 3 and includes two large apertures 30′ and 32′, and two smaller apertures 34′ and 36′. After the mask 28 is made ready, the composite is subjected to a P-type dopant such as boron, and four P+ regions are diffused into the substrate 24. Through the apertures 30′ and 32′ respectively, a source region 30 and a drain region 32 are produced as shown in FIG. 6. FIG. 4 is a cross section taken along the line 4—4 after the P diffusion.

Figure 5:
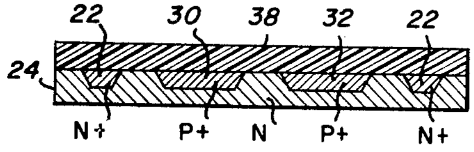
Figure 7:
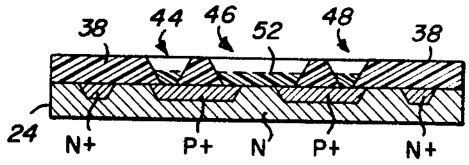
Figure 8:
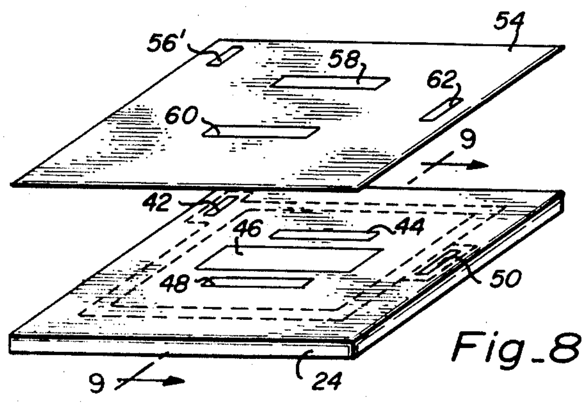

After the P diffusion an oxide 38 is grown over the wafer 24, as shown in FIGS. 5 and 6, so as to provide an insulating medium upon the surface which includes the N+ and P+ regions. A third or "gate" mask 40 including the apertures 42′, 44′, 46′, 48′ and 50′ is then placed over the oxide layer 38, and the holes 42, 44, 46, 58 and 50 are cut through the oxide layer 38 as shown in FIGS. 7 and 8, the hole 46 providing the aperture into which the gate will be subsequently formed. Following this mask, a thin gate oxide 52 is grown over the region separating and including edges of the source and drain regions. It is this layer 52 which is to serve as the insulator separating the metallic gate electrode from the source and drain regions 30 and 32 respectively.

Figure 9:
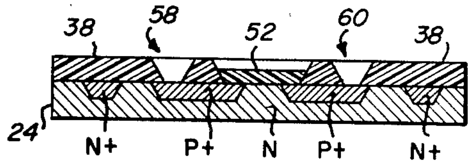

A thin layer of oxide is likewise grown in the other exposed holes also, but these layers will be removed during the next stage of the process. As shown in FIG. 8, a fourth mask 54, including four apertures 56′, 58′, 60′ and 62′, is provided for allowing the unwanted oxide layers to be removed, thus exposing the N and P regions underlying the apertures 56, 58, 60 and 62 as shown in FIGS. 9 and 10.

Figures 10, 11:
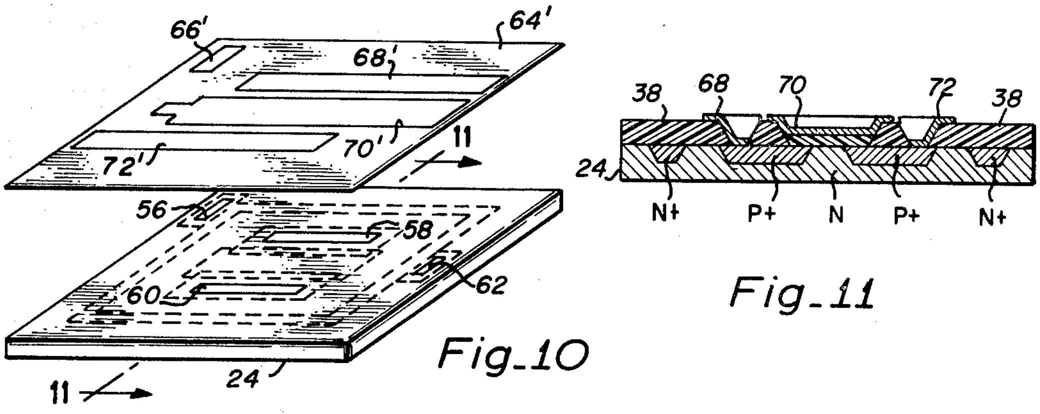

As shown in FIGS. 10 and 11, the fifth and last mask 64 is then provided over the wafer 24, and metal areas 66, 68, 70 and 72 are evaporated onto the wafer through the apertures 66′, 68′, 70′ and 72′ respectively, thus providing a gate electrode 70 as well as metallic contacts to the various elements of the FET.

Figure 12:
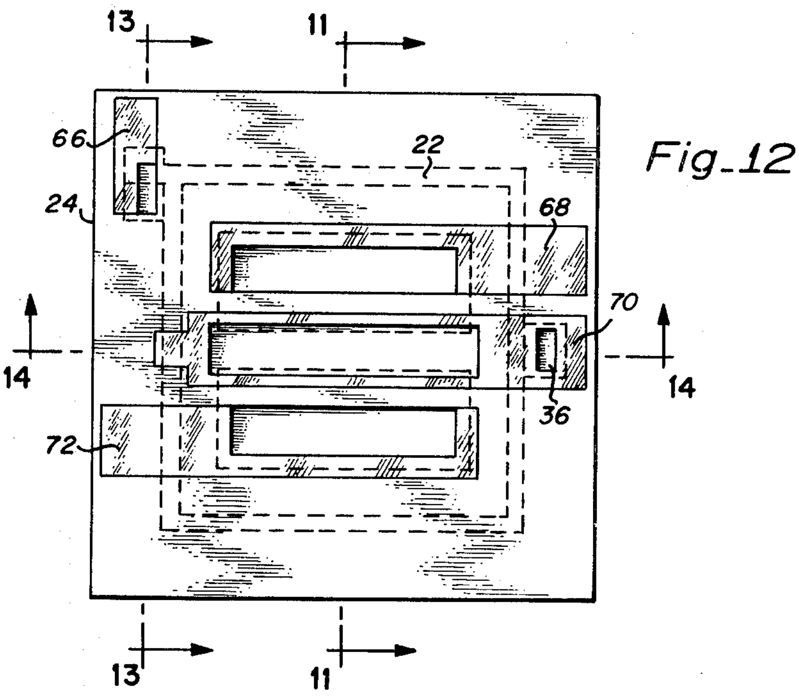
FIG. 12 is an illustration of a completed MISFET made in accordance with the inventive process illustrated in FIGS. 1–11.

Turning now to FIG. 12 which is a plan view of the completed MISFET device, there are shown four metallic strips 66, 68, 70 and 72 which facilitate external contact to the subject device. The metallic strip 66 provides a contacting medium which allows good ohmic contact to be made to the substrate 24, and metallic strips 68 and 72 likewise provide contacting means by which the source and drain regions 30 and 32 respectively can be connected to an external circuit. The metallic strip 70 meanwhile performs the dual function, which will be more fully explained below, of providing a gate electrode and external contacting medium while at the same time connecting a protective diode means 36 in circuit between the gate 70 and the external circuit.

Figure 13:
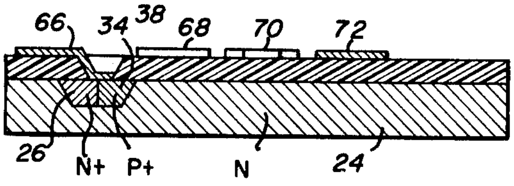
FIG. 13 is a cross section of the FET of FIG. 12 taken along the line 13—13.

Since the starting substrates required for MIS device fabrication are of relatively high resistivity, i.e., in the order of 2 ohms per centimeter, a contact formed by simply alloying the interconnect metal strip 66 to the substrate 24 is non-ohmic. This fact necessitated, in the prior art, an ohmic backside contact which could be connected through a bond or a lead shorted to the package to the topside metal interconnect pattern. However, in accordance with the present invention which provides, in the case of the P-channel device illustrated, an N-type inversion barrier 22 with an adjacent P-type region 34, a good topside ground contact is made possible by the butting together of the regions 26 and 34 and shorting them out to the substrate with the metallic interconnect strip 66 as shown in FIG. 13.

This novel configuration which provides an effective topside ground contact gives rise to at least two significant advantages not known in the prior art. The first advantage is that by using the present method, adequate ground contact can be made at any point on the chip without necessitating a metallic interconnection to other ground points. This saves substantial area on the chip, and significantly simplifies the chip layout. The second advantage is that since ohmic backside contact is not required, more flexible hybrid packaging is possible as well as low temperature die attaching with non-ohmic material.

Another problem which the present invention solves is that it provides a field inversion protection means around the FET device. Since in practice there are many semiconductor devices formed on the same chip in close proximity to each other and these devices are usually interconnected through a series of conductive strips separated from the adjacent doped regions and substrate only by a thin layer of oxide, field inversion may occur and seriously affect the performance of the integrated device. Field inversion is caused when a metal interconnect line is caused to obtain a sufficiently negative voltage so as to invert the surface of the substrate between two adjacent regions of the same conductivity type. If the condition occurs and the two regions are at opposite polarities, serious circuit malfunctions and power drains may occur.

This condition is prevented, however, in accordance with the present invention, by separating any two adjacent interconnected regions with an elongated region of high concentration, e.g., greater than $10^{-7}$ atoms per square centimeter surface concentration N-type impurities diffused into the field region between two adjacent P regions. In the illustrated device this inversion protection region is the ring of N+ material 22 which surrounds the source and drain regions 30 and 32 as shown in FIG. 12. The N-channel device can likewise be protected in the same manner by providing a separating region of P-type material between adjacent interconnected N regions.

Figure 14:
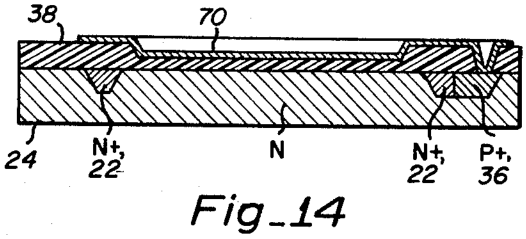
FIG. 14 is a cross section of the FET of FIG. 12 taken along the line 14—14.

Another important feature of the present invention is the provision of a high voltage breakdown protection means of the type shown in FIGS. 12 and 14. This involves the provision of a diode in the gate interconnect 70 comprised of a portion of the N region 22 and the P region 36. Because of the high resistivity substrates used in MIS processing, the lowest diode breakdown that could be effectively achieved heretofore was about 60 volts. These prior art diodes, however, cannot always be pended on since the gate oxide breakdown in the MIS devices of the type described above occurs at about 100 volts, and resistive drops in the prior art diode sometimes permit it to reach the oxide rupture voltage if it draws sufficient current.

On the other hand, by diffusing the N and P regions 22 and 36 together in accordance with the present invention, a low breakdown voltage on the order of 10 volts or less can be provided to offer a substantial improvement over the prior art. In accordance with the invention, any desired breakdown magnitude could be attained by adjusting the concentrations in the P and N regions accordingly. This permits using thinner, lower breakdown oxides for lower threshold. As is the case with all of the features of the present invention, this feature is applicable to both N- and P-channel devices. For P-channel devices, contact is made to the P region while in the N-channel devices contact is made to the N region.

The fundamental sequence of oxidations, predepositions and diffusions described above are unaltered for fabrication of N-channel, P-channel or both N- and P-channel devices simultaneously. For example, exactly the same process illustrated above with respect to the fabrication of a P-channel device can be used to make a similar N-channel device. The only difference is that a substrate of the opposite type is required and the sequence of the first two masks 20 and 28 is reversed. In this case the source and drain regions are formed during the antimony predeposition and diffusion and the field inversion barrier is subsequently formed by the P predeposition and diffusion. As mentioned above, both N- and P-channel devices can be fabricated simultaneously on the same substrate if the substrate contains adjacent regions of N- and P-type material. These adjacent regions can be formed by epitaxial deposition, diffusion or any other suitable method.

One advantage of the N-channel process of the present invention is that it takes advantage of the unique properties of antimony to make the device parameters predictable and stable. In addition to the previously mentioned advantages, the low diffusion coefficient of antimony in silicon dioxide permits the use of a thinner protective oxide during depositions, and also retards penetration of the growing gate oxide after the source and drain regions have been exposed.

Another important characteristic of antimony is its low vapor pressure. When the gate mask is aligned and etched, the etched gate area overlaps and exposes the edge of the source and drain regions. If the vapor pressure of the source-drain dopant is high at the gate oxidation temperature, the gate region (channel and oxide) can become contaminated with the source-drain dopant. This causes variations in threshold due to the resultant variations in channel doping and instabilities associated with the presence of the dopant in the oxide. For example, where phosphorous is the source-drain oxide, it can cause threshold shifts due to polarization of the gate oxide, and surface effects due to its hygroscopic behavior.

Although the above-described embodiments relate to a MOS process, the same approach can be applied equally as well to other dielectric materials as well as other substrate materials. Furthermore, the interconnection pattern can be formed with any suitable metal.

After having read the above disclosure, it will be apparent to those of skill in the art that many alterations and modifications can be made to the subject method and apparatus without departing from the merits of the invention. It is therefore to be understood that this description is for purposes of illustration only and is in no way intended to be of a limiting nature. Accordingly, I intend that the appended claims be interpreted as covering all modifications which fall within the true spirit and scope of my invention.

I claim:

1. A method of making a MISFET device comprising the steps of:
- diffusing through a first mask means, and into a substrate of a first conductivity type, a belt-like region of impurity of said first conductivity type having a higher concentration than said substrate;
- diffusing through a second mask means and into said substrate at least two separated regions of a second conductivity type having a higher concentration than said substrate;
- growing a first layer of oxide over the diffused surface of said substrate;
- etching through a third mask means a plurality of openings in said oxide one of which exposes the region separating said two separated regions of the second conductivity type;

- growing a second oxide layer over said plurality of openings which is thinner than said first layer of oxide;
- etching a way through a fourth mask means all of said second oxide layer except that section covering said region separating said separated regions; and
- depositing through a fifth mask means a plurality of conductive metallic strips on the surface of said device, one of said strips being positioned above said region separating said separated regions and being electrically insulated therefrom by said second oxide layer thus forming a gate means for said device.

2. The method of claim 1 wherein at least one other region of said second conductivity type is diffused into said substrate through said second mask means, said one other region being contiguous with a portion of said belt-like region and wherein a second of said metallic strips deposited through said fifth mask means forms an ohmic contact to both of said contiguous regions at their junction so as to provide a good topside contact to said substrate.

3. The method of claim 1 wherein at least one additional region of said second conductivity type is diffused into said substrate through said second mask means, said additional region being contiguous with said belt-like region and having said gate means ohmically connected thereto as to form a breakdown protection diode means for said gate means.

4. The method of claim 1 wherein the impurity of the first conductivity type is of P-type and the impurity of said second conductivity type is antimony.

5. In a method for making a field effect transistor wherein a first region forming the source and a second region forming the drain are diffused into a substrate and wherein a thin layer of oxide is provided for insulating a metallic gate from said first second regions, the improvement comprising the steps of:
- diffusing into said substrate a third region of the same conductivity type as said first and second regions;
- diffusing into said substrate, contiguous with said third region, a fourth region of the opposite conductivity type; and
- alloying a metallic interconnect to said third region and said fourth region and across the junction therebetween so as to provide a good ohmic topside contact to said substrate.

6. In a method for making a field effect transistor having a source region and a drain region diffused into a substrate and a metallic gate electrode disposed across the region separating said source and drain regions and insulated therefrom by a thin layer of high resistivity material, the improvement comprising the steps of:
- diffusing into said substrate another region of the same conductivity type as said source and drain regions;
- diffusing into said substrate, contiguous with said another region, a region of opposite conductivity type so as to form an N-P junction therebetween; and
- providing an ohmic contact between said gate electrode and said another region thus forming a gate breakdown protection diode means.

References Cited

UNITED STATES PATENTS

| | | | |
|---|---|---|---|
| 3,183,128 | 5/1965 | Leistiko | 29—571 |
| 3,226,612 | 12/1965 | Haenichen | 29—571 |
| 3,456,169 | 7/1969 | Klein | 317—235 |

PAUL M. COHEN, Primary Examiner

U.S. Cl. X.R.

29—577, 587; 317—235